(12) United States Patent
Bass

(10) Patent No.: US 6,956,912 B2
(45) Date of Patent: Oct. 18, 2005

(54) TURBO DECODER WITH CIRCULAR REDUNDANCY CODE SIGNATURE COMPARISON

(76) Inventor: David Bass, 161 Schenck Ave., Great Neck, NY (US) 11021

( * ) Notice: Subject to any disclaimer, the term of this patent is extended or adjusted under 35 U.S.C. 154(b) by 807 days.

(21) Appl. No.: 10/044,109

(22) Filed: Oct. 19, 2001

(65) Prior Publication Data

US 2002/0061079 A1 May 23, 2002

Related U.S. Application Data

(60) Provisional application No. 60/248,440, filed on Nov. 14, 2000.

(51) Int. Cl.⁷ .............................. H03D 1/00; H04L 27/06
(52) U.S. Cl. ....................... 375/341; 375/265; 375/262; 714/794; 714/795; 714/819
(58) Field of Search ................................. 375/341, 262, 375/265, 340; 714/786, 792–795, 819, 755, 756, 780, 704

(56) References Cited

U.S. PATENT DOCUMENTS

| | | | | |
|---|---|---|---|---|
| 6,518,892 B2 | * | 2/2003 | Shen et al. | 341/50 |
| 6,526,531 B1 | * | 2/2003 | Wang | 714/704 |
| 6,591,390 B1 | * | 7/2003 | Yagyu | 714/755 |
| 6,675,342 B1 | * | 1/2004 | Yagyu | 714/755 |
| 6,865,708 B2 | * | 3/2005 | Wang | 714/758 |
| 2001/0028690 A1 | * | 10/2001 | Ebel, Sr. | 375/340 |
| 2001/0052104 A1 | * | 12/2001 | Xu et al. | 714/792 |
| 2002/0010894 A1 | * | 1/2002 | Wolf et al. | 714/793 |

FOREIGN PATENT DOCUMENTS

| EP | 1 009 098 A | 6/2000 |
|---|---|---|
| EP | 1 017 176 A | 7/2000 |
| WO | 01/06662 A | 1/2001 |
| WO | WO 0106662 A | 1/2001 |

OTHER PUBLICATIONS

W.W. Peterson and D.T. Brown, *Cyclic Codes For Error Detection*, Proceedings Of The Ire, Jan. 1961, pp. 228–235.

Rose Y. Shao & Marc P.C. Fossorier, *Two Simple Stopping Criteria For Turbo Decoding*, IEEE Transactions on Communications, Vo. 47, No. 8, Aug. 1999, pp. 1117—1120.

Shao et al., "Two Simple Stopping Criteria for Turbo Decoding", IEEE Transactions on Communications, vol. 47, No. Aug. 8, 1999, pp. 1117–1120.

* cited by examiner

*Primary Examiner*—Phuong Phu
(74) *Attorney, Agent, or Firm*—Volpe and Koenig, P.C.

(57) ABSTRACT

An iterative turbo decoder and method for error correcting communication signal data are provided. The decoder implements a stopping rule through use of signature codes to determine whether successive iterations of decoder data are the same.

16 Claims, 1 Drawing Sheet

TURBO DECODER WITH CIRCULAR REDUNDANCY CODE SIGNATURE COMPARISON

CROSS-REFERENCE TO RELATED APPLICATION

Figure 1:
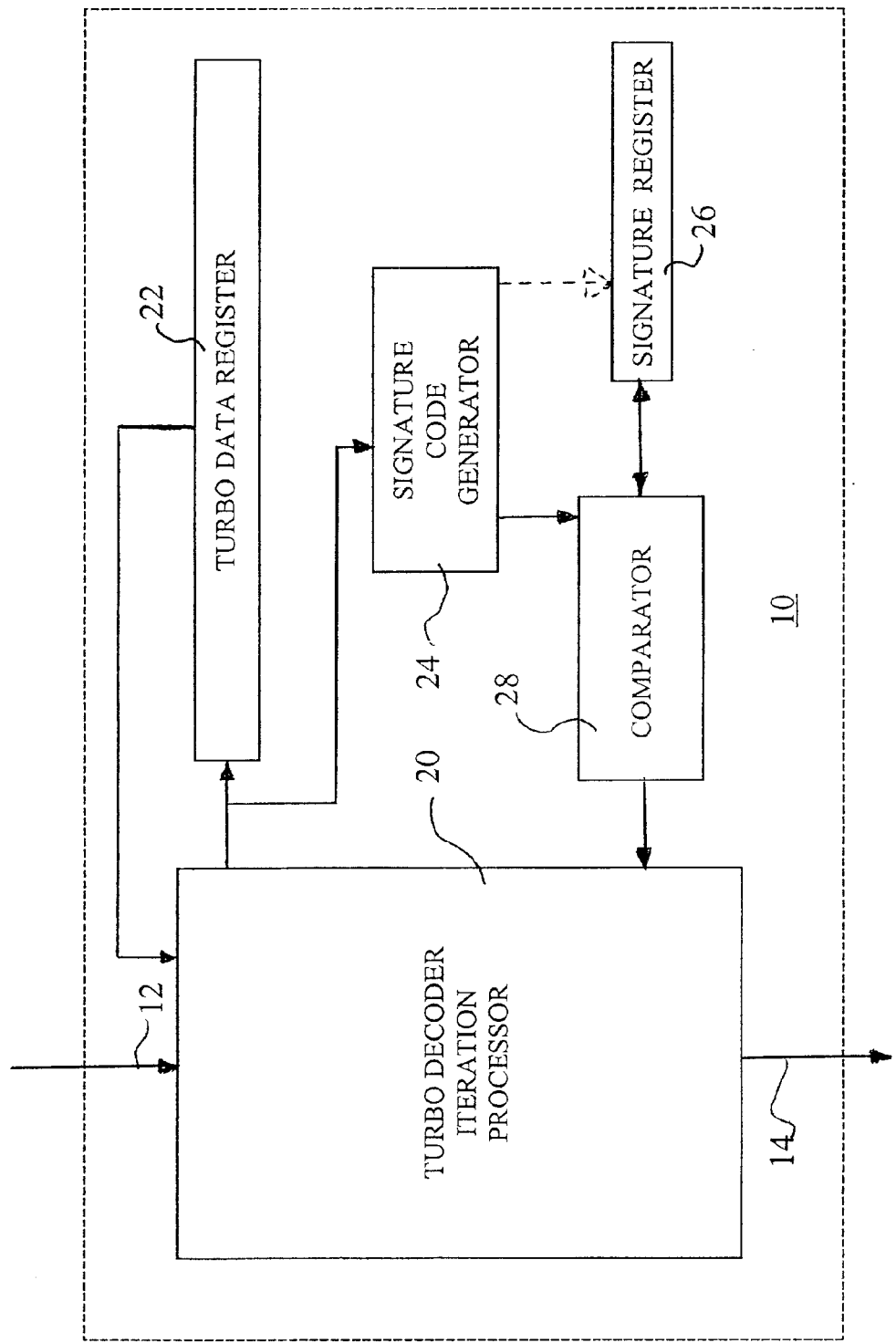

This application claims priority from U.S. Provisional Patent Application Ser. No. 60/248,440, filed Nov. 14, 2000.

FIELD OF THE INVENTION

The present invention relates to communications systems which use error correcting for received communication signals and, in particular, to such systems which utilize iterative turbo decoder systems.

BACKGROUND

Turbo codes are a form of error correcting codes that yield performance near the Shannon limit for performance in an Additive While Gaussian Noise (AWGN) channel in a wireless communication system, such as time division duplex using code division multiple access (TDD/CDMA). Decoders for these codes utilize an iterative algorithm which gives an improved estimate of the transmitted data at each iteration.

A significant design parameter for decoders is the number of iterations to be used. Decoders can be implemented in hardware or software, but in either case the number of iterations used drives the requirement for processing resources, including the processing throughput required to achieve the desired data rate, power consumed in decoding, and the amount of hardware needed in a hardware implementation.

Two general strategies are known in the art for determining the number of iterations in a decoder implementation. First, a fixed number of iterations can be determined as part of the design. This simplifies the implementation, but requires excessive processing resources since the fixed number must be set high enough to give the desired performance, i.e. bit error rate for the expected range of signal to noise levels, for nearly all cases where many decodings would require less than the fixed number of iterations.

Another strategy is to use a stopping rule to dynamically determine when decoding can be terminated without significantly effecting performance. The simplest stopping rule is the hard-decision-aided (HDA) criteria. When using this stopping rule, decoding is terminated when two successive iterations yield the same results. There are no changes in the hard decisions between iterations. Implementation of this rule for a coded block of N bits requires N memory locations to store the results of the previous implementation, as well as comparison of the previous N bit result to the current N bit result.

A typical turbo decoder may produce turbo decoder estimate data having in excess of 5,000 bits of information for each iteration. Accordingly, the implementation of a conventional stopping rule requires an additional memory allocation in excess of 5,000 bits to store a first code iteration for comparison with a next code iteration in order to determine whether the same results have been produced.

The inventor has recognized that it would be desirable to provide an improved turbo decoder which can more efficiently implement a stopping rule with a lesser requirement for additional memory.

SUMMARY

An iterative turbo decoder and method for error correcting communication signal data are provided. The decoder recursively evaluates signal data for a selected number of iterations.

During each iteration, decoder circuitry produces a new estimate of the transmitted data block, also called the extrinsics. A decoder data memory stores the extrinsics generated for one decoding iteration.

Signature code generating circuitry generates code signatures corresponding to each new estimate of the transmitted data block for each decoder iteration. The code signatures are preferably at least 20 times smaller than the data which they represent and for practical purposes will normally be at least 100 times smaller. A relatively small code signature memory stores the code signature corresponding to turbo decoder estimate data generated for one decoding iteration.

A comparator is operatively associated with the signature code circuitry and decoder circuitry. The comparator compares a generated code signature for a new estimate of the transmitted data block being produced and stored for a present decoder iteration with the contents of the signature memory. If the comparison reflects equality, the decoder circuitry ceases iteration processing. If the comparison reflects inequality, the generated code signature is stored in the signature memory where it is available for comparison relative to a code signature for a next decoder iteration.

The comparator may be used to store the generated code in the signature register. As an alternative, the comparator may simply access the signature register before the signature code generator outputs the new signature code. This permits the signature code generator to output the new signature code to both the comparator and to the signature register, as indicated in phantom, which eliminates the need for the comparator to perform a store operation to the signature code register.

Preferably, the comparator is operatively associated with the decoder circuitry to control decoder circuitry iteration processing only after a selected minimum number of iterations have occurred. Also, preferably the decoder circuitry ceases iteration processing if a predetermined limit of iterations has occurred. The limit of iterations is preferably an integer at least three greater than the selected minimum number. In a preferred embodiment, the selected minimum number is four (4) and the limit is eight (8).

It is an object of the present invention to provide an iterative turbo decoder which selectively implements a stopping rule with a lesser memory requirement than the prior art.

Other objects and advantages of the present invention will be apparent from the following description of a presently preferred embodiment.

BRIEF DESCRIPTION OF THE DRAWING(S)

FIG. 1 is a schematic diagram of a turbo decoder made in accordance with the teachings of the present invention.

DETAILED DESCRIPTION OF THE PREFERRED EMBODIMENT(S)

With reference to FIG. 1, there is shown a turbo decoder 10 having a communication signal input 12 and an output 14. The turbo decoder 10 includes turbo decoding iteration processing circuitry 20 and an associated turbo data register 22. The decoder processing circuitry 20 receives data blocks of communication signals via input 12 and generates a new estimate of the transmitted data block which is stored in register 22. The processing circuitry 20 is recursively associated with the turbo data register 22 such that the processor 20 utilizes the contents of the turbo data register 22 for the second and each successive iteration of turbo decoding processing.

The turbo decoding processing circuitry 20 is preferably configured with a predetermined limit as to the number of processing iterations which will occur for any given block of communication data such that the turbo decoder output is based upon the contents of the turbo decoder register after the last decoding iteration. Preferably, the maximum number of processing iterations performed by the processor 20 is eight (8).

The processor 20 also implements a stopping rule where fewer than the maximum number of iterations are needed. When the decoder determines that the estimate data being generated for successive iterations is not changing, iterative processing is stopped. In lieu of providing a relatively large amount of additional memory to store a prior iteration of estimate data, a relatively simplistic signature code generator 24 and a relatively small code signature register 26 are provided as inputs to a comparator 28 which is operatively associated with the iteration processor 20 to implement the stopping rule.

Preferably, the comparator 28 is operatively associated with the decoder circuitry 20 to control decoder circuitry iteration processing only after a selected minimum number of iterations have occurred. Also, preferably the decoder circuitry 20 ceases iteration processing if a predetermined limit of iterations has occurred. The limit of iterations is preferably an integer at least three greater than the selected minimum number. In a preferred embodiment, the selected minimum number is four (4) and the limit is eight (8).

For a turbo decoder which generates binary estimate data on the order of 5,114 bits for a single iteration, the signature code generator preferably comprises a simple 16-bit binary divider which divides the 5,114 binary string of data by a selected 16-bit binary number and outputs the remainder which results from the division function to the comparator 28. The remainder will necessarily not exceed 16 bits since the divisor is 16 bits in length.

For a 16-bit divisor, preferably the binary number 1000000000000011 is utilized. Such a divisor corresponds to a binary polynomial represented as $1+x^{14}+x^{15}$. The binary division performed by code generator 24, mathematically corresponds to dividing a binary polynomial representation of the 5,114 bit iteration estimate data by the polynomial $1+x^{14}+x^{15}$ using binary (i.e. modulo 2) mathematics. The remainder of the binary division corresponds to the remainder polynomial. The odds that the remainder will be the same for two successive 5,114 bit string of estimate data are about 1 in $2^{16}$ which the inventor has determined is an acceptable risk factor.

Mathematical correspondence and use of polynomial representations to generate signal codes is known in the art and is discussed in, Pearson, W. W. and Brown, D. T., "Signal Codes For Error Detection", *Proceedings of the IRE*", January 1961. The inventor has recognized that this form of encoding has application to turbo decoders.

In operation, the turbo decoder processor 20 outputs, for a given iteration, N bits of estimate data to the turbo data register 22 and signal code generator 24. The signal code generator 24 generates a corresponding code signature having M bits which is preferably at least 100 times smaller than N which is input to the comparator 28. The comparator 28 compares the M bit signature code input from the code generator 24 with the contents of the signature register 26 to determine if they are equal.

If the comparator determines equality, a signal is sent to the processor 20 to stop iteration processing and output the turbo coding results. If the comparator detects inequality, the M-bit signature code received from the signature code generator 24 is stored in the signature register 26.

The comparator 28 may be used to store the generated code in the signature register 26. As an alternative, the comparator 28 may simply access the signature register 26 before the signature code generator 24 outputs the new signature code. This permits the signature code generator 24 to output the new signature code to both the comparator 28 and to the signature register 26, as indicated in phantom, which eliminates the need for the comparator 28 to perform a store operation to the signature code register 26.

Where a 5,114 bit block of binary data is produced for a decoder iteration, the signature code generator 24 preferably divides by 1000000000000011 to produce a remainder of no greater than 16 bits so that the signature register 26 need only have a 16-bit storage capacity.

The present invention is particularly suited to hardware implementations where the cost of generating the signature code is small, and the cost of the additional memory required would be high. It can also be used, however, in software implementations.

What is claimed is:

1. An iterative turbo decoder for error correcting communication signal data which recursively evaluates signal data for a selected number of iterations comprising:

a decoder data memory for storing turbo decoder estimate data generated for one decoding iteration;

a signature memory for storing a code signature corresponding to turbo decoder estimate data generated for one decoding iteration;

decoder circuitry for producing decoder estimate data for each iteration of decoding and storing it in said decoder data memory;

signature code generating circuitry for generating code signature corresponding to turbo decoder data for each decoder iteration such that each code signatures is at least twenty times smaller than the corresponding turbo decoder data; and a comparator operatively associated with the signature code circuitry and decoder circuitry for comparing a generated code signature for turbo decoder estimate data being produced and stored for a present decoder iteration with the contents of the signature memory such that if the comparison reflects equality, the decoder circuitry ceases iteration processing and if the comparison reflects inequality, the generated code signature is stored in the signature memory where it is available for comparison relative to a code signature for a next decoder iteration.

2. An iterative turbo decoder according to claim 1 wherein said comparator is operatively associated with said decoder circuitry to cease decoder circuitry iteration processing only after a selected number of iterations have occurred and said decoder circuitry ceases iteration processing if a predetermined limit of iterations has occurred where said limit is an integer at least three greater than the selected number.

3. An iterative turbo decoder according to claim 2 wherein the selected number is four (4) and the limit is eight (8).

4. An iterative turbo decoder according to claim 1 wherein said signature code generating circuitry generates code signatures such that each code signature is at least 100 times smaller than the corresponding turbo decoder data.

5. An iterative turbo decoder according to claim 1 wherein the turbo decoder estimate data is a binary string and said signature code generating circuitry comprises a binary divider which divides corresponding binary strings of decoder data by a selected binary divisor and outputs the remainder of the division to the comparator as the code signature.

6. An iterative turbo decoder according to claim 5 wherein the decoder estimate data binary strings are at least 5,000 bits in length and the binary divisor is a 16-bit binary number whereby the code signatures are no greater than 16 bits.

7. An iterative turbo decoder according to claim 6 wherein the divisor is 10000000000000011.

8. An iterative turbo decoder according to claim 1 wherein the generated code signature is stored in the signature memory to be available for comparison relative to a code signature for a next decoder iteration by said comparator.

9. An iterative turbo decoder according to claim 1 wherein the generated code signature is stored in the signature memory to be available for comparison relative to a code signature for a next decoder iteration by said signature code generating circuitry.

10. A method for an iterative turbo decoder that error corrects communication signal data by recursively evaluating signal data for a selected number of iterations comprising:

producing decoder estimate data for each iteration of decoding and storing it in a decoder data memory;

generating code signatures corresponding to turbo decoder estimate data for each decoder iteration such that each code signature is at least twenty times smaller than the corresponding turbo decoder estimate data; and comparing a generated code signature for turbo decoder estimate data being produced and stored for a present decoder iteration with the contents of a signature memory such that if the comparison reflects equality, iteration processing is stopped and if the comparison reflects inequality, the generated code signature is stored in the signature memory where it is available for comparison relative to a code signature for a next decoder iteration.

11. A method according to claim 10 wherein a minimum number of decoding iterations are performed before decoder iteration processing is stopped and decoder circuitry iteration processing is stopped if a predetermined limit of iterations has occurred where said limit is an integer at least three greater than the minimum number.

12. A method according to claim 11 wherein the minimum number is four (4) and the limit is eight (8).

13. A method according to claim 10 wherein the turbo decoder estimate data for each processing iteration is a binary string and the signature codes are generated by binary dividing corresponding binary strings of decoder data by a selected binary divisor and outputting the remainder of the division for comparison as the code signature.

14. A method according to claim 13 wherein the decoder estimate data binary strings are at least 5,000 bits in length and the binary divisor is a 16-bit binary number whereby the code signatures are no greater than 16 bits.

15. A method according to claim 14 wherein the divisor is 10000000000000011.

16. A method according to claim 10 wherein the generated code signature is stored in the signature memory to be available for comparison relative to a code signature for a next decoder iteration by signature code generating circuitry.

* * * * *

UNITED STATES PATENT AND TRADEMARK OFFICE
CERTIFICATE OF CORRECTION

PATENT NO. : 6,956,912 B2  Page 1 of 1
APPLICATION NO. : 10/044109
DATED : October 18, 2005
INVENTOR(S) : David Bass It is certified that error appears in the above-identified patent and that said Letters Patent is hereby corrected as shown below:

IN THE CLAIMS

At claim 1, column 4, line 37, after the word "code", delete "signatures" and insert therefor --signature--.

Signed and Sealed this

Nineteenth Day of December, 2006

JON W. DUDAS
*Director of the United States Patent and Trademark Office*